(12) United States Patent
Rembert et al.

(10) Patent No.: US 12,439,562 B2
(45) Date of Patent: Oct. 7, 2025

(54) THERMAL DISSIPATION

(71) Applicant: STMicroelectronics (Grenoble 2) SAS, Grenoble (FR)

(72) Inventors: Richard Rembert, Quai xen Chartreuse (FR); Fanny Laporte, Villaz (FR); Catherine Cadieux, Grenoble (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 205 days.

(21) Appl. No.: 17/989,173

(22) Filed: Nov. 17, 2022

(65) Prior Publication Data
US 2023/0171927 A1 Jun. 1, 2023

(30) Foreign Application Priority Data
Nov. 30, 2021 (FR) ...................................... 2112736

(51) Int. Cl.
*H05K 7/20* (2006.01)
(52) U.S. Cl.
CPC .................................. *H05K 7/2039* (2013.01)
(58) Field of Classification Search
CPC ...................................................... H01L 23/40
See application file for complete search history.

(56) References Cited

U.S. PATENT DOCUMENTS

| | | | | |
|---|---|---|---|---|
| 9,674,940 | B2* | 6/2017 | Lee | ................... H01L 23/49822 |
| 2003/0029637 | A1* | 2/2003 | Barcley | ................ H05K 1/0206 |
| | | | | 174/262 |
| 2006/0284304 | A1* | 12/2006 | Caletka | ................... H01L 24/83 |
| | | | | 257/E23.105 |
| 2013/0333934 | A1 | 12/2013 | Hurwitz et al. | |
| 2014/0352135 | A1 | 12/2014 | Hu | |
| 2017/0018501 | A1 | 1/2017 | Maple et al. | |
| 2020/0243464 | A1* | 7/2020 | Hsu | ................... H01L 23/49816 |

OTHER PUBLICATIONS

INPI Search Report and Written Opinion for priority application, FR 2112736, report dated Jul. 7, 2022, 9 pgs.

* cited by examiner

*Primary Examiner* — Mukundbhai G Patel
(74) *Attorney, Agent, or Firm* — Crowe & Dunlevy LLC

(57) ABSTRACT

A heat dissipation device includes a substrate with a network of thermally-conductive vias and thermally-conductive layers. The substrate has a first surface and a second surface opposite to the first surface. A heat dissipation interface layer including a stack of a first layer made of a first thermally-conductive material and a second layer made of a second thermally-conductive material. The first material is different from the second material. A surface of the first layer is coplanar with the first surface of the substrate. At least one of the thermally-conductive vias of said network supports and is in contact with the first layer. At least one opening thoroughly crosses the stack of the first and second layers. Material of the substrate fills the opening in the first layer.

23 Claims, 2 Drawing Sheets

THERMAL DISSIPATION

PRIORITY CLAIM

This application claims the priority benefit of French Application for Patent No. 2112736, filed on Nov. 30, 2021, the content of which is hereby incorporated by reference in its entirety to the maximum extent allowable by law.

TECHNICAL FIELD

The present disclosure generally concerns electronic systems and devices and, more particularly, the means used to dissipate the heat generated by such electronic systems and devices.

BACKGROUND

Many techniques of cooling and dissipation of the heat generated by electronic systems and devices are known. It is, for example, known to use substrates especially adapted to dissipating the heat generated by the components and circuits of the electronic device or system.

It is desirable to be able to at least partly improve the heat dissipation means of electronic devices.

There is a need for more efficient heat dissipation means of electronic devices.

SUMMARY

Embodiments herein overcome all or part of the disadvantages of known heat dissipation devices.

An embodiment provides a heat dissipation device comprising: a substrate comprising a network of thermally-conductive vias and thermally-conductive layers extending between a first surface of the substrate and a second surface of the substrate opposite to the first surface; and a heat dissipation interface layer comprising a stack of a first layer made of a first thermally-conductive material and a second layer made of a second thermally-conductive material, the first material being different from the second material. A surface of the first layer is coplanar with the first surface of said substrate. At least one of said thermally-conductive vias of said network is in contact with said first layer. The stack comprises at least one opening thoroughly crossing both the first and second layers. Material of the substrate fills the at least one opening in the first layer.

According to an embodiment, the first thermally-conductive material is copper or an alloy comprising copper.

According to an embodiment, the second thermally-conductive material is selected from the group consisting of: nickel-gold (NiAu), nickel-palladium-gold (NiPdAu), an alloy comprising nickel, an alloy comprising gold, an alloy comprising palladium, tin, an alloy comprising tin, an alloy used for soldering such as the alloy comprising tin, silver, and copper, an alloy of ENIG (Electroless nickel immersion gold) type, an alloy of ENEPIG (Electroless Nickel Electroless Palladium Immersion Gold) type, an organic material of OSP (Organic Surface Preservation) type.

According to an embodiment, the opening has a cylindrical shape.

According to an embodiment, the opening has a cylindrical shape with a polygonal, rectangular, square, oblong, oval, or round base.

According to an embodiment, wherein the at least one opening comprises at least two openings thoroughly crossing the stack.

According to an embodiment, said at least two openings have the same dimensions.

According to an embodiment, said at least two openings have different dimensions.

According to an embodiment, wherein the at least one opening comprises comprises a plurality of openings thoroughly crossing the stack and arranged in the form of an array.

According to an embodiment, the device further comprises a lower thermally-conductive layer arranged on the second surface of said substrate.

Another embodiment provides an electronic device comprising the previously-described heat dissipation device, and an electronic chip assembled on said heat dissipation device.

According to an embodiment, the electronic chip comprises a fourth surface bonded to a fifth surface of said heat dissipation interface layer opposite to the substrate.

According to an embodiment, said fourth surface is bonded via a glue layer to said fifth surface.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless otherwise specified, when reference is made to absolute positional qualifiers, such as the terms "front", "back", "top", "bottom", "left", "right", etc., or to relative positional qualifiers, such as the terms "above", "below", "upper", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Figure 1:
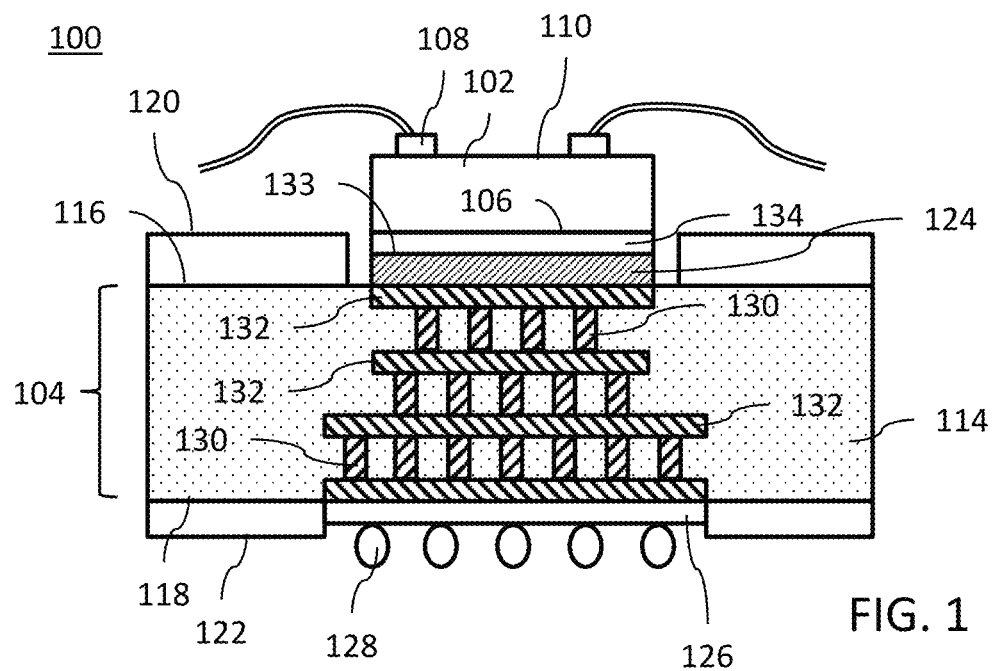
FIG. 1 shows a simplified cross-section view of an embodiment of an electronic device.

FIG. 1 is a cross-section view of an embodiment of an electronic device 100 comprising an electronic integrated circuit chip 102 assembled on a heat dissipation device 104.

Chip 102 is schematically represented in FIG. 1 by a rectangular block. Chip 102 comprises various electronic circuits and components likely to generate heat during their operation. More particularly, chip 102 is likely to generate heat in different hot spots, at least one hot spot being positioned on one of its surfaces 106, this surface 106 being the surface by which chip 102 is bonded to heat dissipation device 104. Here, a hot spot refers to a portion of the surface of chip 102 emitting heat during the operation of chip 102. Chip 102 may comprise other hot spots positioned on surfaces other than surface 106.

Chip 102 may further comprise one or a plurality of, generally a plurality of, contacts 108 formed on a surface 110 opposite to surface 106. Contacts 108 are, for example, intended to be coupled to other contacts of other electronic devices, for example, by solder wires. In FIG. 1, two contacts 108 are shown, and only two portions of solder wires, bonded to these contacts 108, are shown. According to an example, solder wires are bonded by a wire solder method.

Heat dissipation device 104 comprises a substrate 114 made of an electrically-insulating material. According to an example, this electrically-insulating material may be selected from the group consisting of: an electrically-insulating resin, a mixture of electrically-insulating resins, fiberglass, a fiberglass mixture, and a mixture of resins and of fiberglass. Substrate 11 may further be a printed circuit board or a laminate substrate comprising a stack of layers of different materials. Substrate 114 comprises an upper surface 116 and a lower surface 118 opposite to upper surface 116. Upper surface 116 is covered with an adhesive layer 120, and lower surface 118 is covered with a protective layer 122.

According to an embodiment, device 104 further comprises a heat dissipating interface layer 124 (hatched in FIG. 1) formed from surface 116 of substrate 114 and in a cavity formed in adhesive layer 120. Interface layer 124 is described in further detail in relation with FIGS. 2 and 3.

Device 104 further comprises a lower heat dissipating layer 126 extending at the level of surface 118 of substrate 114 and in a cavity formed in protection layer 122. Layer 126 is preferably positioned under layer 124 and may have, for example, a larger surface area than layer 124. Layer 126 is, for example, made of a metallic material, for example, an alloy comprising nickel and/or gold, or in another thermally-conductive metal alloy. Layer 126 may rest on thermally-conductive balls 128, for example, metal balls such as solder balls.

Device 104 further comprises an array of thermally-conductive vias 130 and of thermally-conductive tracks 132 thermally coupling layers 124 and 126. More particularly, at least one via 130 or one conductive track 132 of the network is in contact with layer 124, and at least one via 130 or one conductive track 132 is in contact with layer 126. Vias 130 and tracks 132 are for example, further, electrically conductive. Vias 130 and tracks 132 are, for example, made of a metallic material, for example, of a metal, such as copper, or of a metal alloy, such as an alloy comprising copper. A via 130 and/or a metal track 132 is in contact with interface layer 124, and another via and/or another metal track 132 is in contact with lower layer 126 128. According to an alternative embodiment, the network of vias 130 and of tracks 132 may be replaced with a single electrically-conductive via.

Chip 102 is assembled on device 104 by bonding its surface 106 on an upper surface 133 of heat dissipating interface layer 124, that is, on a free surface of interface layer 124 opposite to substrate 114. For this purpose, chip 102 is, for example, bonded to interface layer 124 via a glue layer 134. Glue layer 134 may be adapted to conducting the heat dissipated by the hot spots of chip 102.

When chip 102 is in operation and its hot spots generate heat, this heat is conducted by, successively, interface layer 124, the network of vias 130 and of tracks 132, lower layer 126 and, eventually, balls 128, to finally be dissipated at the level of the "back side" of substrate 114, that is, on the side of its surface 118.

Figure 2:
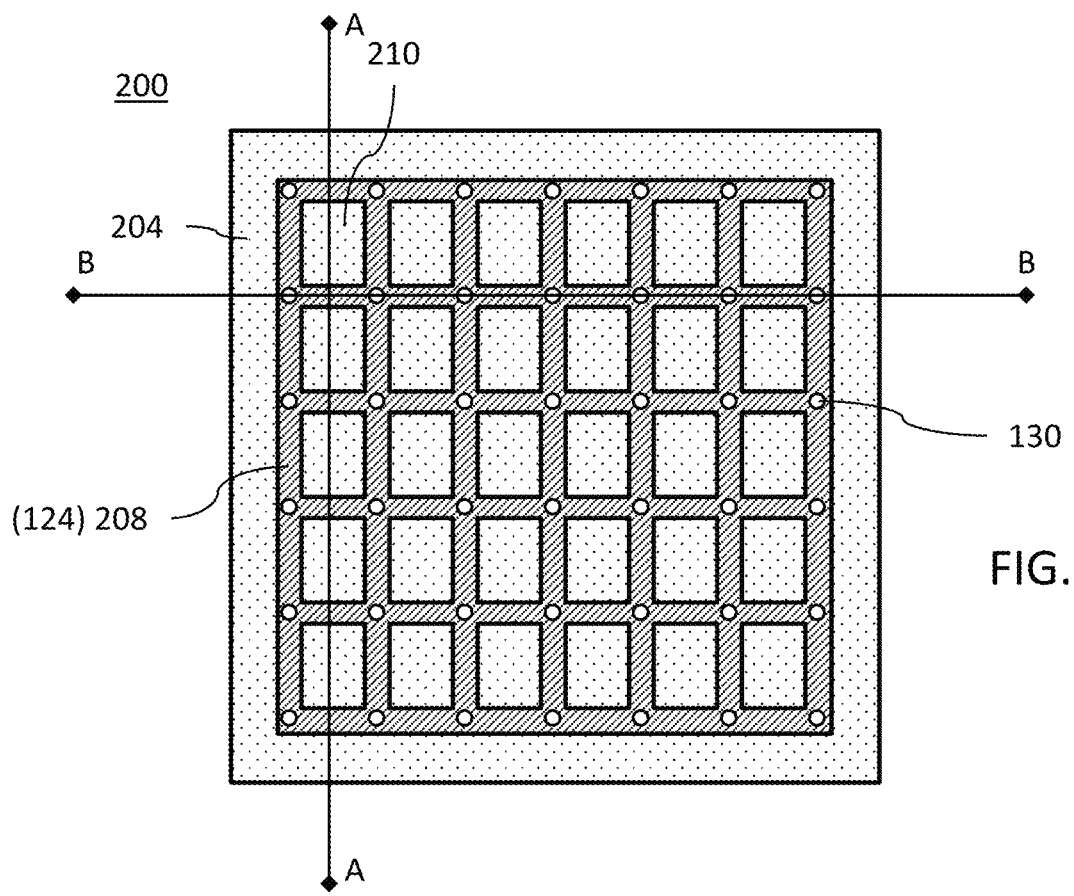
FIG. 2 shows a more detailed top view of a portion of the device of FIG. 1.
Figure 3A:
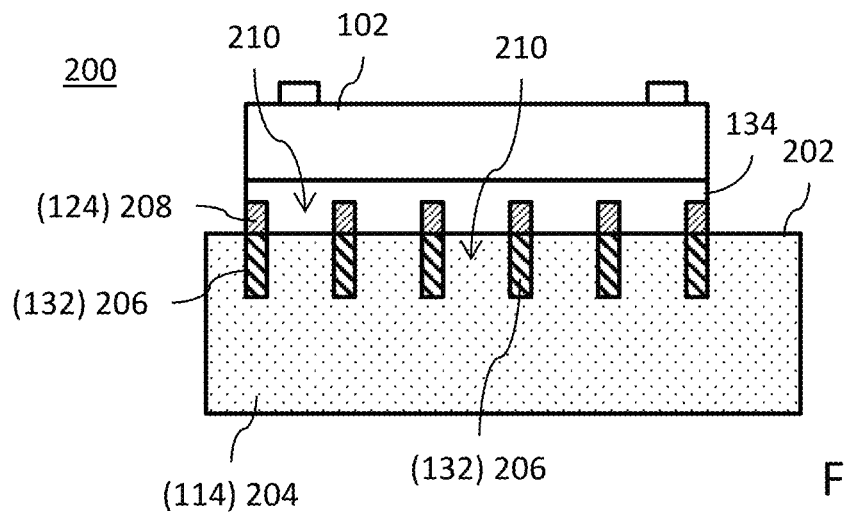
FIG. 3A and 3B show more detailed cross-section views of a portion of the device of FIG. 1 taken along axes AA and BB of FIG. 2.
Figure 3B:
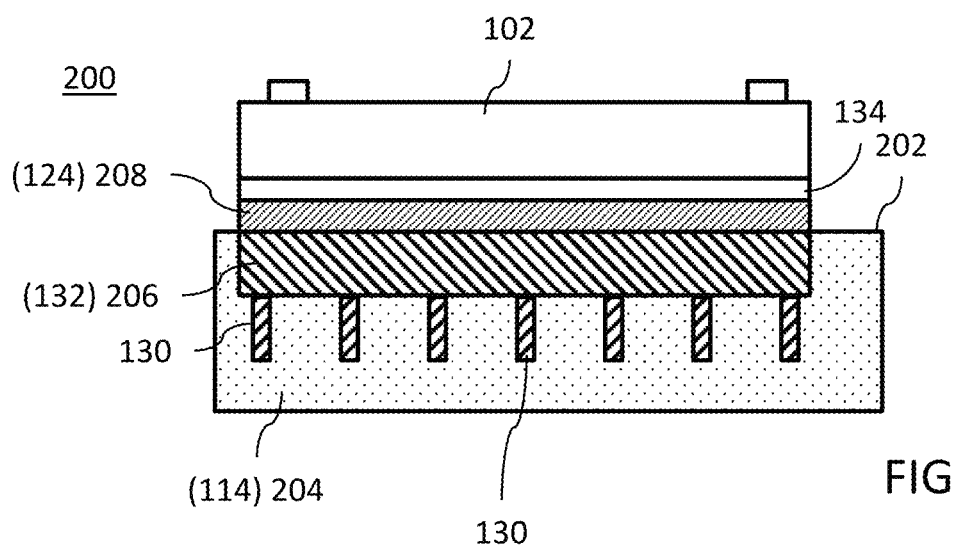

FIGS. 2 and 3A-3B are, respectively, a top view and a cross-section views of a layer 200 of the type including the uppermost layer 132 and the heat dissipating interface layer 124 described in relation with FIG. 1 formed at and in a surface 202 of a substrate 204 of the type of the substrate 114 described in relation with FIG. 1. FIGS. 3A and 3B are cross-section views of FIG. 2 along axis AA and axis BB, respectively.

Layer 200 is formed by a stack of a first layer 206 made of a first thermally-conductive material and of a second layer 208 made of a second thermally-conductive material. First layer 206 extends in substrate 204 from its surface 202. First layer 206 corresponds to the uppermost layer 132 in FIG. 1. Second layer 208 rests on the first layer. Second layer 208 corresponds to the layer 124 in FIG. 1. According to an example, first layer 206 has a thickness in the range from 8 to 35 µm, for example, in the order of 17 µm. According to an example, second layer 208 has a thickness in the range from 4 to 12 µm, for example, in the order of 8 µm.

According to an embodiment, layers 206 and 208 are metal layers. According to an embodiment, the first thermally-conductive material is copper, or an alloy comprising copper. According to an embodiment, the second conductive material is selected from the group consisting of: nickel-gold (NiAu), nickel-palladium-gold (NiPdAu), an alloy comprising nickel, an alloy comprising gold, an alloy comprising palladium, tin, an alloy comprising tin, an alloy used for soldering such as the alloy comprising tin, silver, and copper, an alloy of ENIG (Electroless nickel immersion gold) type, an alloy of ENEPIG (Electroless Nickel Electroless Palladium Immersion Gold) type, an organic material of OSP (Organic Surface Preservation) type.

According to an embodiment, the layers 206 and 208 comprise at least one opening 210 thoroughly crossing through both layers 206 and 208. This opening 210, for example, has a cylindrical shape with a rectangular or square base, but may, according to an alternative embodiment, have an oblong, oval, round, or also polygonal base. As shown in FIG. 3, at the level of opening 210, substrate 204 fills the opening in layer 206 (so that substrate 204 is not recessed with respect to layer 206). The placing of an opening 210 may take into account a plurality of rules. A first rule is that opening 210 is not positioned at a location where the opening is likely to be in contact with a via or a thermally-conductive track of the network of substrate 204. A second optional rule is that opening 210 is not positioned at a location likely to be in contact with a hot spot of an electronic chip.

According to an embodiment, the stack comprises a plurality of openings 210 distributed across the surface of layer 200. The different openings 210 may have different shapes and dimensions, and may be arranged to respect the previously-defined positioning rules. In FIG. 2, circles represent locations of vias 103 of the network of substrate 200 in the layer immediately below layer 206 (uppermost layer 132 of FIG. 1).

Layer 200 with layers 206 and 208 may comprise full spaces, that is, spaces with no opening 210 at the level of the hot spots of the chip, and spaces at the locations where the least amount of heat is generated. A solid portion of layer 200 has a maximum surface area in the order of 20 mm².

According to a preferred embodiment shown in FIG. 2, the stack comprises a plurality of openings 210 of rectangular or square shape and arranged in an array. Openings 210 may be arranged relative to one another with a pitch in the range from 305 to 585 µm, and have a width in the range from 120 to 400 µm. Openings 210 may be spaced apart by a distance in the order of 185 µm. By using dimensions of this type, the surface of layer 200 may cover from 50 to 85% of the area of the chip surface which is assigned thereto.

An advantage of using a layer 200 having one or a plurality of openings 210 is that such a layer 200 has a better bonding to substrate 204 (reference 114 of FIG. 1), that is, a better adhesion to substrate 204 (as opposed to just bonding to the metal of layer 208 alone).

Various embodiments and variants have been described. Those skilled in the art will understand that certain features of these various embodiments and variants may be combined, and other variants will occur to those skilled in the art. It will be within the abilities of those skilled in the art to adapt the dimensions and the shape of openings 210 to optimize the bonding of layer 200 on substrate 204, and the heat dissipation of an electronic chip.

Finally, the practical implementation of the described embodiments and variations is within the abilities of those skilled in the art based on the functional indications given hereabove.

The invention claimed is:

1. A heat dissipation device, comprising:
   an insulating substrate having a first surface and a second surface and comprising a network of thermally-conductive vias and a first layer made of a first thermally-conductive material located in and having an upper surface coplanar with the first surface of the insulating substrate and further having a lower surface in contact with the network of thermally-conductive vias;
   a heat dissipation interface comprising a second layer made of a second thermally-conductive material, the first material being different from the second material, stacked on and in contact with the first layer made of the first thermally conductive material above the upper surface of the insulating substrate;
   wherein at least one opening thoroughly crosses both the first layer and the second layer;
   wherein sidewalls of the at least one opening which crosses the first layer are in alignment with sidewalls of the at least one opening which crosses the second layer; and
   wherein said at least one opening in the first layer is filled by material of the insulating substrate.

2. The device according to claim 1, wherein the first thermally-conductive material is copper or an alloy comprising copper.

3. The device according to claim 1, wherein the second thermally-conductive material is selected from the group consisting of: nickel-gold, nickel-palladium-gold, an alloy comprising nickel, an alloy comprising gold, an alloy comprising palladium, tin, an alloy comprising tin, an alloy used for soldering such as the alloy comprising tin, silver, and copper, an alloy of Electroless nickel immersion gold (ENIG) type, an alloy of Electroless Nickel Electroless Palladium Immersion Gold (ENEPIG) type, an organic material of Organic Surface Preservation (OSP) type.

4. The device according to claim 1, wherein the at least one opening has a cylindrical shape.

5. The device according to claim 4, wherein the cylindrical shape has a polygonal, rectangular, square, oblong, oval, or round base.

6. The device according to claim 1, wherein said at least one opening comprises at least two openings thoroughly crossing the first and second layers of the stack.

7. The device according to claim 6, wherein said at least two openings have same dimensions.

8. The device according to claim 6, wherein said at least two openings have different dimensions.

9. The device according to claim 1, wherein said at least one opening comprises a plurality of openings arranged in the form of an array.

10. The device according to claim 1, further comprising a lower thermally-conductive layer arranged in and having a lower surface coplanar with the second surface of said insulating substrate, and wherein the lower thermally-conductive layer is thermally coupled to the network of thermally-conductive vias.

11. An electronic device, comprising:
    a heat dissipation device comprising:
       an insulating substrate having a first surface and a second surface and comprising a network of thermally-conductive vias and a first layer made of a first thermally-conductive material located in and having an upper surface coplanar with the first surface of the insulating substrate and further having a lower surface in contact with the network of thermally-conductive vias;
       a heat dissipation interface comprising a second layer made of a second thermally-conductive material, the first material being different from the second material, stacked on and in contact with the first layer made of the first thermally conductive material above the upper surface of the insulating substrate;
       wherein at least one opening thoroughly crosses both the first layer and the second layer; and
       wherein said at least one opening in the first layer is filled by material of the insulating substrate; and
    an electronic chip mounted to said heat dissipation device by an adhesive material filling said at least one opening in the second layer to contact the material of the insulating substrate filling said at least one opening in the first layer.

12. The device according to claim 11, wherein the electronic chip is bonded to a surface of the second layer of said heat dissipating interface layer.

13. The device according to claim 11, wherein said adhesive material is a glue layer.

14. The device according to claim 11:
    wherein the first thermally-conductive material is copper or an alloy comprising copper; and
    wherein the second thermally-conductive material is selected from the group consisting of:
    nickel-gold, nickel-palladium-gold, an alloy comprising nickel, an alloy comprising gold, an alloy comprising palladium, tin, an alloy comprising tin, an alloy used for soldering such as the alloy comprising tin, silver, and copper, an alloy of Electroless nickel immersion gold (ENIG) type, an alloy of Electroless Nickel Electroless Palladium Immersion Gold (ENEPIG) type, an organic material of Organic Surface Preservation (OSP) type.

15. The device according to claim 11, further comprising a lower thermally-conductive layer arranged in and having a lower surface coplanar with the second surface of said insulating substrate, and wherein the lower thermally-conductive layer is thermally coupled to the network of thermally-conductive vias.

16. The device according to claim 15, further comprising:
a protection layer at the second surface of said insulating substrate;
wherein the protection layer includes a cavity at said lower thermally-conductive layer; and
a lower heat dissipating layer within said cavity and in contact with said lower thermally-conductive layer.

17. The device according to claim 11, further comprising:
a protection layer at the first surface of said insulating substrate; and
wherein the protection layer includes a cavity at said first layer made of the first thermally-conductive material;
wherein said second layer made of a second thermally-conductive material and said electronic chip are located within said cavity.

18. A heat dissipation device, comprising:
an insulating substrate having a first surface and a second surface and comprising:
  a network of thermally-conductive vias located in an insulating material of the insulating substrate; and
  a first layer made of a first thermally-conductive material located in the insulating material of the insulating substrate and having a lower surface in contact with the network of thermally-conductive vias and an upper surface coplanar with the first surface of the insulating substrate; and
a second layer made of a second thermally-conductive material over the insulating substrate, the first material being different from the second material, having a lower surface in contact with the upper surface of the first layer;
wherein the first and second layer form a heat dissipation interface having at least one opening thoroughly crossing both the first layer and the second layer;
wherein the insulating material of the insulating substrate fills a portion of the at least one opening located in the first layer; and
wherein sidewalls of the at least one opening crossing the first layer are in alignment with sidewalls of the at least one opening crossing the second layer.

19. The device according to claim 18, wherein the first thermally-conductive material is copper or an alloy comprising copper and the second thermally-conductive material is selected from the group consisting of: nickel-gold, nickel-palladium-gold, an alloy comprising nickel, an alloy comprising gold, an alloy comprising palladium, tin, an alloy comprising tin, an alloy used for soldering such as the alloy comprising tin, silver, and copper, an alloy of Electroless nickel immersion gold (ENIG) type, an alloy of Electroless Nickel Electroless Palladium Immersion Gold (ENEPIG) type, an organic material of Organic Surface Preservation (OSP) type.

20. The device according to claim 18, wherein the insulating substrate further comprises a lower thermally-conductive layer located in the insulating material of the insulating substrate and having a lower surface coplanar with the second surface of the insulating substrate, and wherein the lower thermally-conductive layer is thermally coupled to the network of thermally-conductive vias.

21. The device according to claim 18, wherein the at least one opening has a cylindrical shape having a polygonal, rectangular, square, oblong, oval, or round base.

22. The device according to claim 18, wherein said at least one opening comprises a plurality openings.

23. The device according to claim 22, wherein the plurality of openings are arranged in the form of an array of openings, each opening in the array having a same size and shape.

* * * * *